(12) United States Patent
Cohen et al.

(10) Patent No.: US 10,707,148 B2
(45) Date of Patent: Jul. 7, 2020

(54) ELBOW CONTACT FOR FIELD-EFFECT TRANSISTOR AND MANUFACTURE THEREOF

(71) Applicant: International Business Machines Corporation, Armonk, NY (US)

(72) Inventors: Guy Cohen, Yorktown Heights, NY (US); Christian Lavoie, Yorktown Heights, NY (US); Ahmet Serkan Ozcan, San Jose, CA (US); Paul Solomon, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/587,980

(22) Filed: Sep. 30, 2019

(65) Prior Publication Data

US 2020/0027820 A1  Jan. 23, 2020

Related U.S. Application Data

(63) Continuation of application No. 15/816,913, filed on Nov. 17, 2017, now Pat. No. 10,541,191.

(51) Int. Cl.
*H01L 23/48* (2006.01)
*H01L 21/768* (2006.01)
*H01L 21/02* (2006.01)
*H01L 21/48* (2006.01)

(52) U.S. Cl.
CPC ........ *H01L 23/48* (2013.01); *H01L 21/02008* (2013.01); *H01L 21/4885* (2013.01); *H01L 21/7688* (2013.01)

(58) Field of Classification Search
CPC .......... H01L 29/66795; H01L 29/1054; H01L 29/66818; H01L 21/76816; H01L 27/10814; H01L 29/41791
See application file for complete search history.

(56) References Cited

U.S. PATENT DOCUMENTS

| | | | |
|---|---|---|---|
| 6,548,343 B1 | 4/2003 | Summerfelt | |
| 6,815,752 B2 | 11/2004 | Kitamura | |
| 10,541,191 B2 * | 1/2020 | Cohen | ........... H01L 23/485 |
| 2001/0034106 A1 | 10/2001 | Moise | |
| 2002/0113237 A1 | 8/2002 | Kitamura | |
| 2005/0145908 A1 | 7/2005 | Moise | |
| 2009/0233382 A1 | 9/2009 | Moise | |
| 2009/0280641 A1 | 11/2009 | Kang | |
| 2014/0187046 A1 | 7/2014 | Posseme | |
| 2014/0264883 A1 | 9/2014 | Tsai | |
| 2016/0049394 A1 | 2/2016 | Shin | |

(Continued)

OTHER PUBLICATIONS

United States Notice of Allowance dated Sep. 12, 2019, in U.S. Appl. No. 15/816,913.

(Continued)

*Primary Examiner* — Changhyun Yi
(74) *Attorney, Agent, or Firm* — L. Jeffrey Kelly, Esq.; McGinn IP Law Group, PLLC

(57) ABSTRACT

A field-effect transistor (FET) and method of manufacture thereof include patterning a mask above a source and drain of a FET to form holes in the mask, growing epitaxial structures from the holes in the mask, and growing a doped epitaxial shell to coat sidewalls of the epitaxial structures.

5 Claims, 7 Drawing Sheets

(56) References Cited

U.S. PATENT DOCUMENTS

2016/0126246 A1    5/2016  Lee
2019/0035795 A1*  1/2019  Boemmels .......... H01L 29/7802
2019/0074362 A1    3/2019  Lee

OTHER PUBLICATIONS

United States Office Action dated Jul. 16, 2019, in U.S. Appl. No. 15/816,913.
United States Office Action dated Apr. 2, 2019, in U.S. Appl. No. 15/816,913.
United States Office Action dated Nov. 27, 2018, in U.S. Appl. No. 15/816,913.

* cited by examiner

ELBOW CONTACT FOR FIELD-EFFECT TRANSISTOR AND MANUFACTURE THEREOF

CROSS-REFERENCE TO RELATED APPLICATIONS

The present application is a Continuation Application of U.S. patent application Ser. No. 15/816,913, filed on Nov. 17, 2017, the entire contents of which are hereby incorporated by reference.

BACKGROUND

The present invention relates generally to a contact for a field-effect transistor (FET), and more particularly, but not by way of limitation, to a contact that uses the vertical dimension between gates and above sources and drains to increase contact area and thus decrease external resistance of a FET and method of manufacture thereof.

As device scaling progresses and devices are fit into an increasingly tight pitch to increase density, the available area for contacting the active device shrinks and this leads to an increase in the device contact resistance, which is deleterious since the intrinsic device resistance is decreasing, by design, in order to improve performance.

SUMMARY

In an exemplary embodiment, the present invention can provide a field-effect transistor (FET) including source and drain regions, the FET including a gate a semiconductor pillar grown on top of the source and drain regions, and a conductive sheath flanking the pillar, the sheath is bent up, or vertical, alongside the gate.

Other details and embodiments of the invention will be described below, so that the present contribution to the art can be better appreciated. Nonetheless, the invention is not limited in its application to such details, phraseology, terminology, illustrations and/or arrangements set forth in the description or shown in the drawings. Rather, the invention is capable of embodiments in addition to those described and of being practiced and carried out in various ways that should not be regarded as limiting.

As such, those skilled in the art will appreciate that the conception upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

Aspects of the invention will be better understood from the following detailed description of the exemplary embodiments of the invention with reference to the drawings, in which.

DETAILED DESCRIPTION

Figure 1:
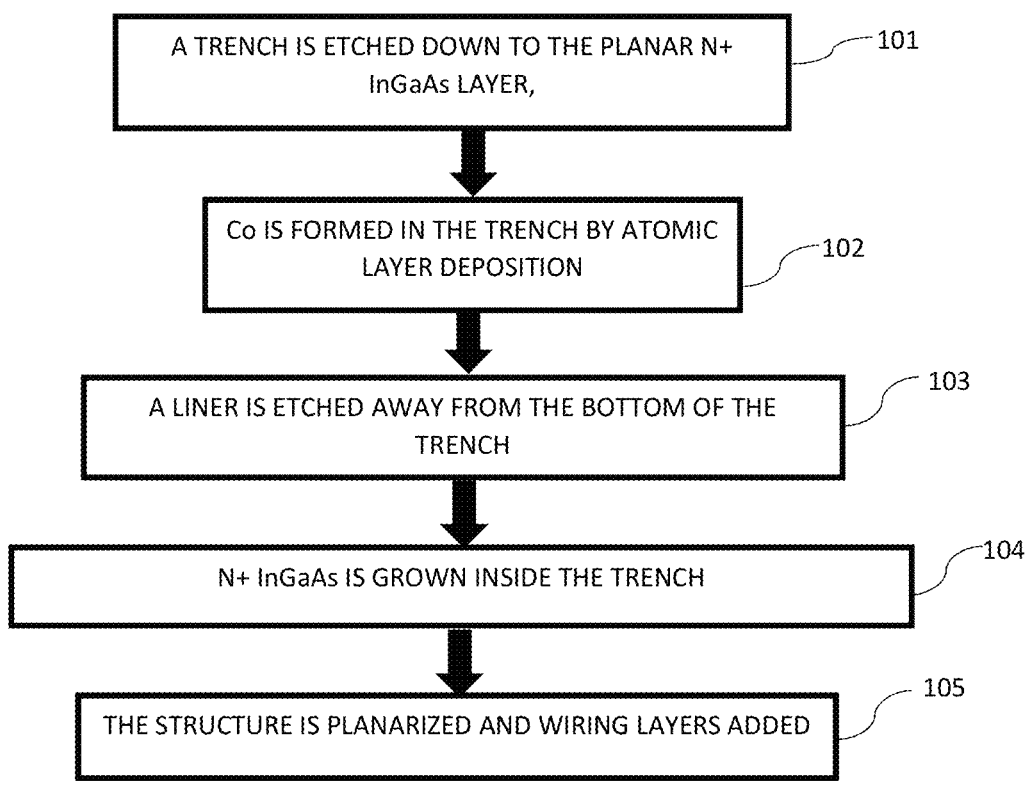
FIG. 1 exemplarily shows a high-level flow chart for a contact method 100 according to an embodiment of the present invention.

The invention will now be described with reference to FIGS. 1-6F, in which like reference numerals refer to like parts throughout. It is emphasized that, according to common practice, the various features of the drawings are not necessarily to scale. On the contrary, the dimensions of the various features can be arbitrarily expanded or reduced for clarity.

By way of introduction of the example depicted in FIG. 1, an embodiment of a contact method 100 according to the present invention can include various steps and structure for a contact of which utilizes the dimension out of plane i.e. growing the active region up, alongside the gate, to allow for the use of the vertical dimension to increase the contact area by three times or more compared to the conventional horizontal contact.

Figure 2:
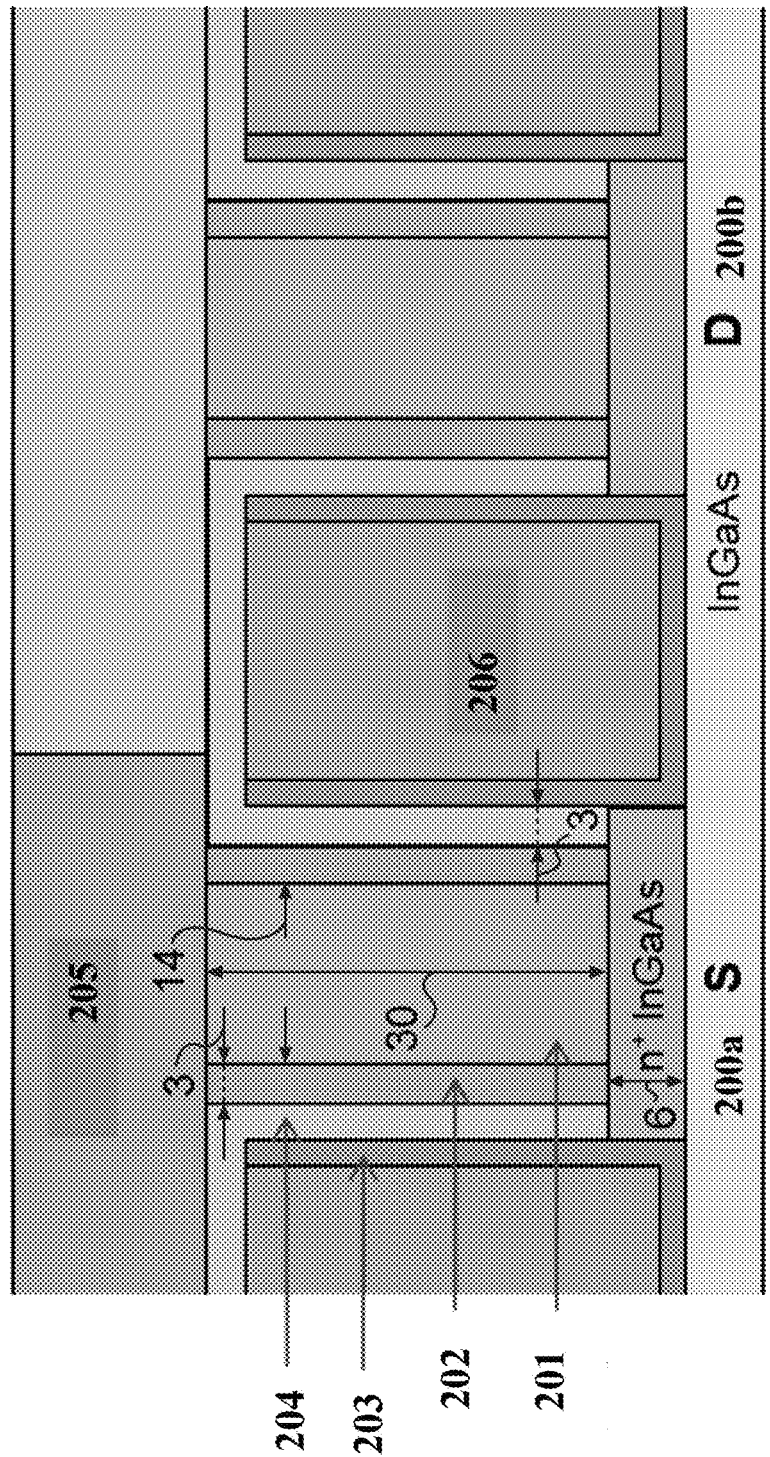
FIG. 2 exemplarily depicts a cross-section of an InGaAs FET 250 using 7 nm ground rules showing the elbow contact according to an embodiment of the present invention.

Referring generally to FIG. 2, FIG. 2 exemplarily depicts one embodiment of the structure of the contact.

FIG. 2 depicts a cross-section of an InGaAs FET 250 using 7 nm ground rules showing the elbow contact. When the FET is viewed in a cross section, the vertical conducting sheath forms an elbow shape when the upper metal line is included.

The embodiment of FIG. 2 includes a pillar 201 of n+ InGaAs grown on top of the planar InGaAs source 200a and drain regions 200b of the FET 250. The pillar 201 is flanked by a thin conducting metal (Co, Ti, Ni, Cu, . . . ) or thin conducting alloy sheath 202. The sheath increases the area on InGaAs in contact with the metal thereby lowering the contact resistance. The sidewalls of gate 206 are surrounded by a layer of hafnium oxide ($HfO_2$) 203, silicon dioxide ($SiO_2$) 204, and tungsten (W) 205. The bottom part of the gate which is controlling the channel has a thin layer of a dielectric such as $HfO_2$ and does not include the $SiO_2$ and tungsten films.

Selected dimensions are given in nanometers in FIG. 2. Region 201 (the pillar) is about 14 nm wide while it is about 30 nm high. Regions 202 (metal sheath), 203 (HfO2) and 204 (SiO2) are all about 3 nm wide (or thick). The n+ InGaAs layer above the source and drain is about 6 nm thick. The range of thicknesses can all be about +/−50%, with regions 202, 203 and 204 having minimum thicknesses of about 2 nm and the n+ InGaAs regions above the source and drain a minimum thickness of about 5 nm.

As shown, the semiconductor active region is bent up, or vertical alongside the gate, to allow for the vertical dimension to be used to increase the contact area by at least a factor of three compared to the near horizontal contact at the bottom of a trench.

Using 7 nm node dimensions and corresponding resistivity values for these dimensions (given in Table 1 below), calculations, show first that the contact area can be increased by a factor of three and taking into account the typical intrinsic contact resistivity of the interface metal/InGaAs also show that the contact resistance can be decreased by 2.5 to ~20Ω-μm.

TABLE 1

Bulk & contact resistivities

| Material | Res. | units |
|---|---|---|
| Cu | 0.06 | Ω-μm |
| W | 0.3 | Ω-μm |
| Co | 0.3 | Ω-μm |
| n+ InGaAs | 4 | Ω-μm |
| n+ InGaAs | 1 | Ω-μm$^2$ |

Referring now to FIG. 1, FIG. 1 exemplarily depicts a method of manufacture of the FET 250.

In step 101, after the FET 250 is formed including the planar source 200a and drain 200b regions, a trench is etched down to the planar n+ InGaAs layer.

Figure 3A:
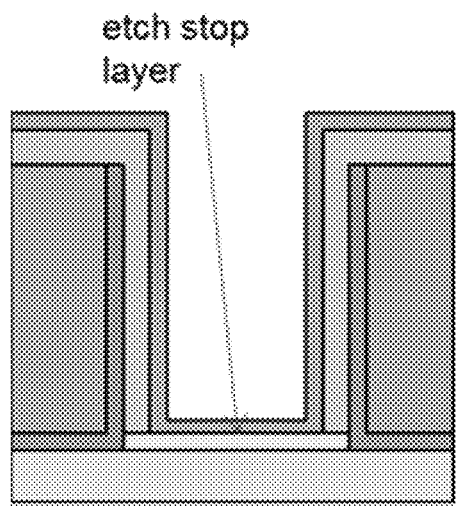
FIG. 3A-3B exemplarily depicts an embodiment of elbow contact where an etch stop layer is added on top of the channel layer and then selectively removed.
Figure 3B:
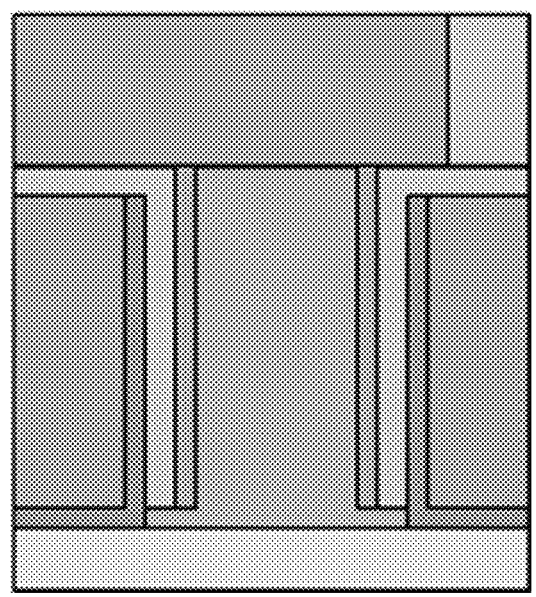

In step 102, a metal sheath is formed in the trench by atomic layer deposition, chemical vapor deposition (CVD), or the like. In step 103, the liner (or sheath) is etched away from the bottom of the trench. In step 104, n+ InGaAs is epitaxially grown inside the trench. In step 105, the structure is planarized and wiring layers added. It is noted that the metal over the gate represent the standard wiring layer. In one embodiment, an extra etch-stop layer may be added on top of the channel layer, as shown in FIGS. 3A-3B. This may protect the channel layer during etch-back of the Co sheath. After the etch-back of the Co sheath, the etch-stop layer is selectively removed, leaving a clean surface for the n+ epi growth. Alumina (Al$_2$O$_3$) is a possible material for this etch-stop. As shown in FIGS. 3A-3B, an etch stop layer is added on top of the channel layer and then selectively removed.

In another embodiment, should it be a challenge to grow epi in a metal-lined trench, the method 100 may form the liner from an insulator then replace it later, by etch back and subsequent ALD deposition of a metal. The use of this replacement liner allows to deposit the epitaxial n+ InGaAs pillar 201 without reacting the InGaAs with the metal during the deposition. Such reaction can take place if the deposition temperature is high enough to form a metal-InGaAs alloy. Another advantage of the replacement liner approach is that is allows the use of a broader range of surface cleaning chemistry (such as dilute HCl) before the deposition of the epitaxial n+ InGaAs pillar 201.

Figure 4:
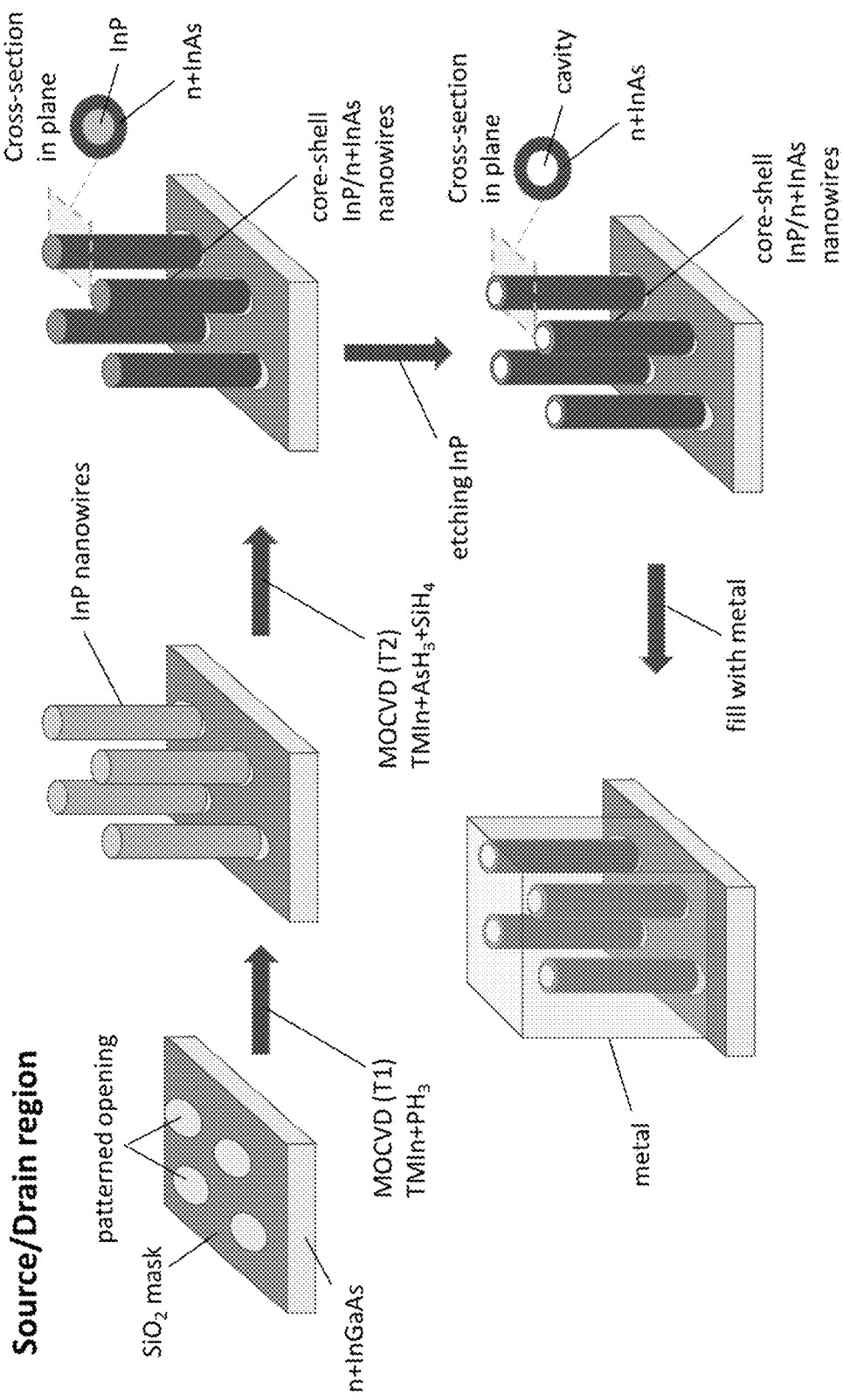
FIG. 4 exemplarily depicts an alternative embodiment for growing pillars and coating the pillars with a metal layer.

FIG. 4 exemplarily depicts an alternate embodiment to increase the contact area using the vertical dimension between gates to form an elbow contact. In FIG. 4, free-standing epitaxial pillars are grown by patterning a mask 402 over the source and drain region (200a, 200b) of the device and using a growth chamber to grow pillars perpendicular to the substrate. In one embodiment, InP pillars are cladded with n+ InGaAs or n+ InAs and are grown from the InGaAs surface of the source 200a and drain 200b regions, through holes 404 in a hard mask 402 (e.g. an oxide layer). The growth 408 of the core InP pillars 406 is typically achieved using a growth method such as metal-organic chemical vapor deposition (MOCVD) with trimethylindium (TMIn) as the indium source and phosphine (PH$_3$) as the phosphorus source. The growth 410 of the shell n+ InAs cladding 412 is also done by MOCVD, but typically at a higher growth temperature (T2) which promotes radial growth over "pillar" growth. Pillar growth temperature T1 is typically lower than cladding (radial) growth temperature T2. The typical precursors for growth 410 are trimethylindium (TMIn) and arsine (AsH$_3$) as the arsenic source. The doping of the n+ InAs cladding layer 412 is usually achieved by introducing the dopant during the growth (a method referred to as in-situ doping). Examples of dopants are silicon (Si), tin (Sn) or tellurium (Te). An example of a precursor used for Si in-situ doping is silane (SiH$_4$). Following the growth, the InP core 406 is etched selectively with respect to the n+ InAs shell 412 by dry etching and/or wet etching. For example, diluted HCl will etch InP without attacking arsenide alloys such as InAs or InGaAs. The n+ InAs tubes' 414 inner and outer surfaces are then coated with a metal 416 such as cobalt (Co), or nickel (Ni) or a multi-layer metal coating. Any gaps between the metal coated tubes and voids inside the tubes can be further filled with a metal such as tungsten (W). To increase the contact area, multiple pillars are used. In another embodiment an elongated "pillar" may be formed. This is done by etching an elongated trench in the hard mask. In yet another embodiment that is simpler for processing, only the pillars (core material) are grown of a doped material (e.g. n+ InAs), and they are directly contacted. We further note that the definition of the plurality of holes 404 in the hard mask 402 can be done by conventional lithography and RIE, or by using self-assembled mask such as diblock copolymer, where the hole sizes and spacing between holes can be tuned.

Figure 5A:
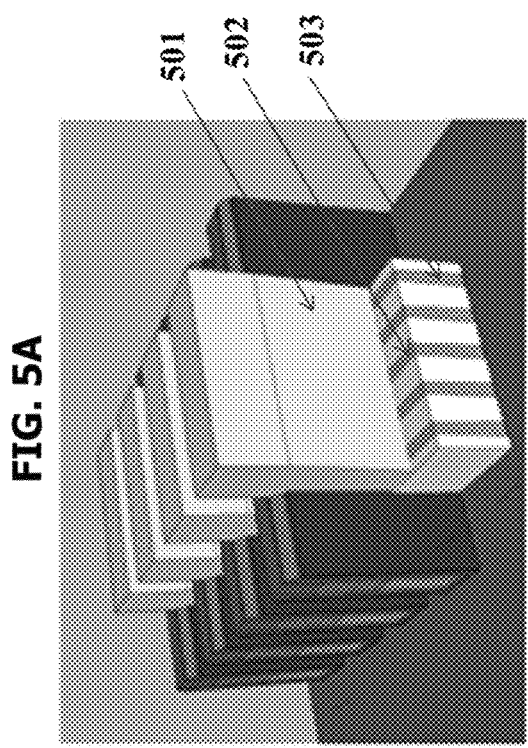
FIG. 5A exemplarily depicts a FinFET contact.
Figure 5B:
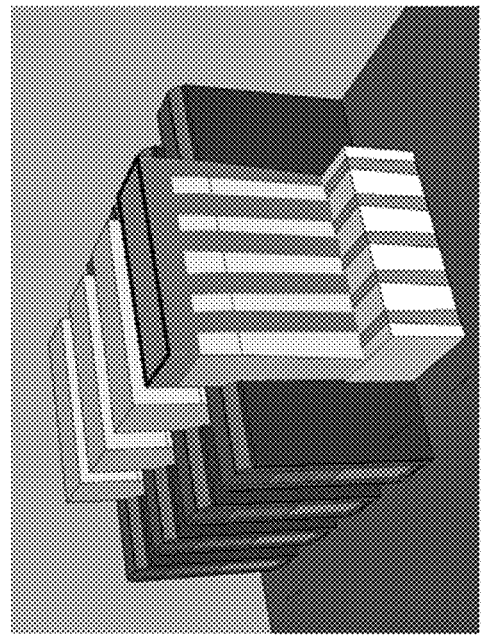
FIG. 5B exemplarily depicts a FinFET contact in which a doped epi is first grown in trench followed by the formation of metal ribs.
Figure 5C:
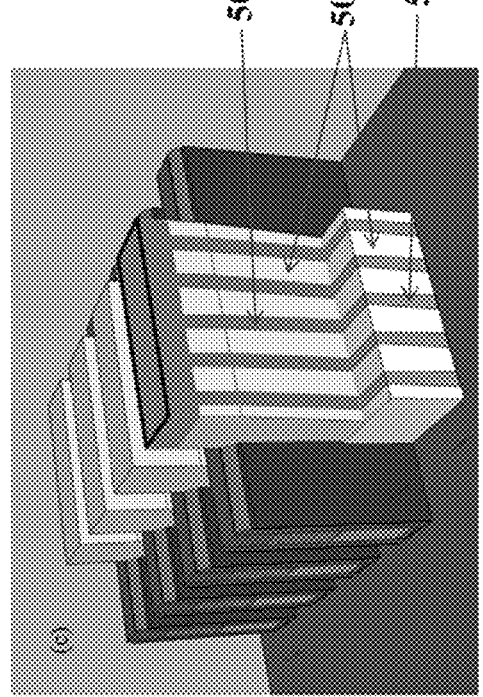
FIG. 5C depicts alternate alignment of ribs to fins.

FIGS. 5A-5C exemplarily depict another method of using the vertical dimension in a trench in order to increase contact area and structure formed thereof. FIG. 5A depicts a standard FinFET contact with a trench contact 501, fins 503, and n+ Si epi 502. In FIG. 5B, a doped epi is first grown in the trench. The epi is then patterned to form ribs, and then filled with metal, conducting silicide or alloy. In FIG. 5C, the alternate alignment of ribs 504 to fins 503 is depicted. The method used to form contacts depicted in FIG. 5 which makes use of the vertical dimension of a trench to increase the contact area is further described using FIG. 6 where the FIN mask is used again to perform an etch into the epitaxial layer to increase the contact area.

Figure 6B:
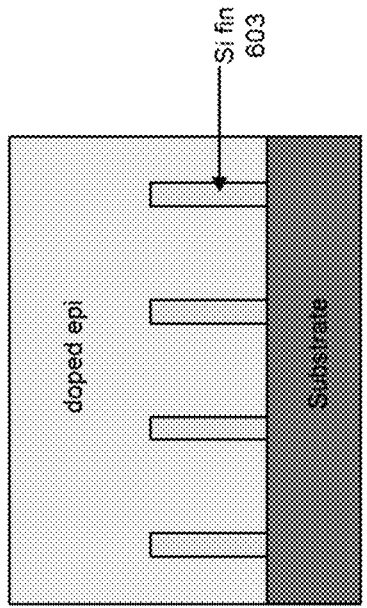
FIGS. 6A-6F exemplarily depict an embodiment of the FinFET contact described in FIGS. 5A-5C.
Figure 6D:
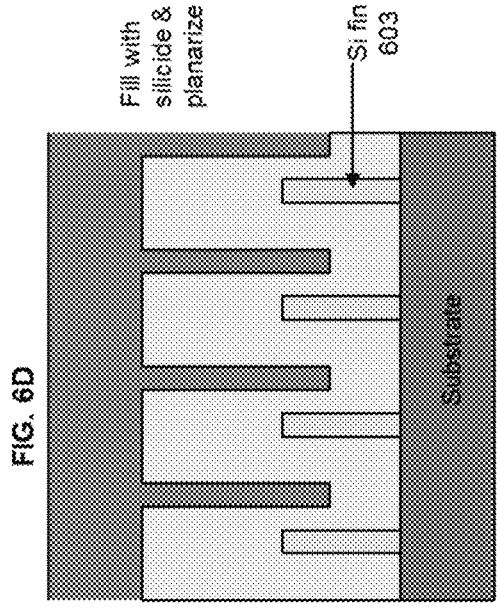
Figure 6A:
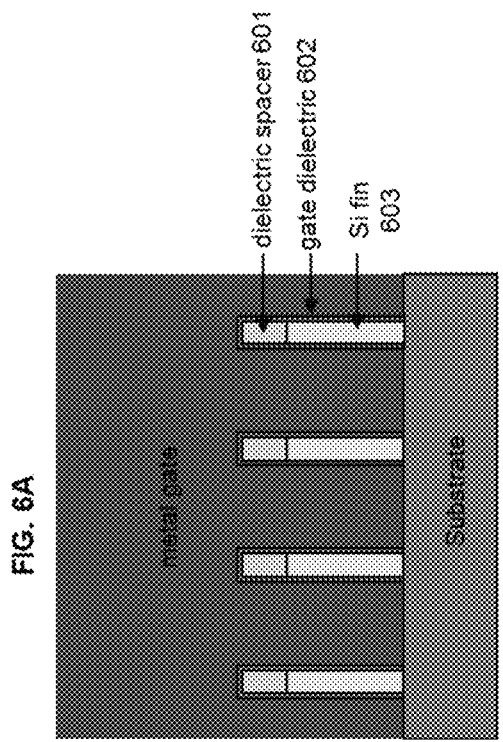
Figure 6C:
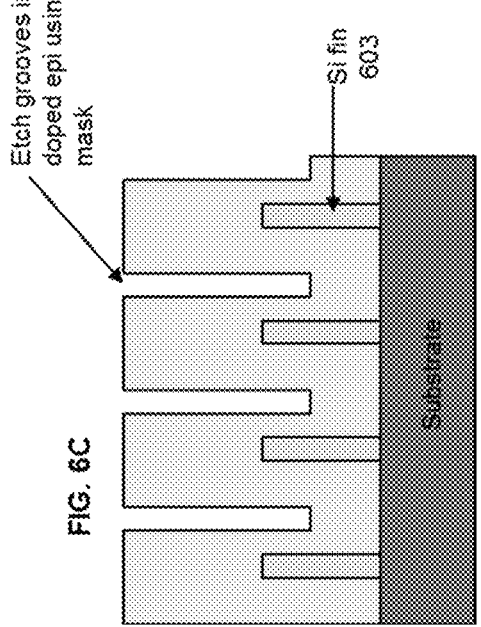

FIGS. 6A-6F depict a method and structure of generating fin contacts in trench. FIG. 6A exemplarily depicts a FinFET section through the gate region and FIG. 6B depicts a section through the S/D region where heavily doped epitaxial semiconductor has been grown in between and over the fins. FIG. 6C depicts grooves cut into the epitaxial using the fin mask and FIG. 6D depicts these grooves after they filled with metal or conducting silicide. Here the increased contact area decreases the contact resistance.

Figure 6F:
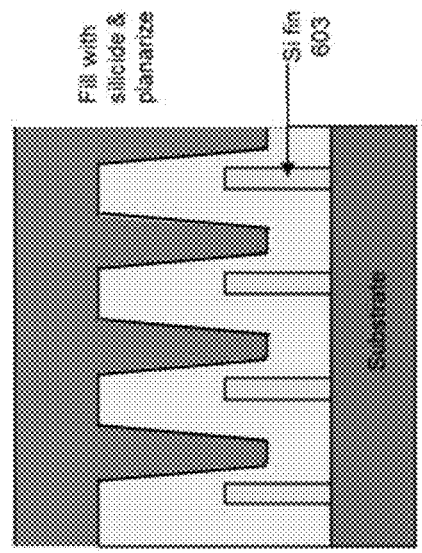
Figure 6E:
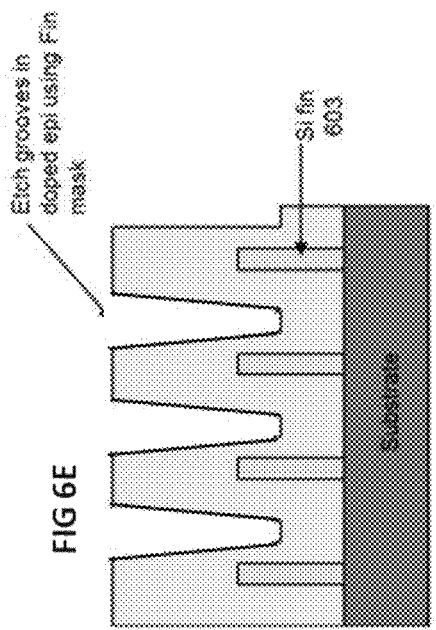

If the etch down of the epitaxial semiconductor in the trench is not perfectly directional, the area and transfer length will be enhanced. For example, as depicted in FIGS. 6E-6F, if one is etching either a dielectric or the semiconductor directly, it is relatively simple to get trenches that are not vertical. Thus, one needs to control how isotropic (or anisotropic) the etch is.

In other embodiments, the semiconductor filled trench can be etch with alternatives means than the FIN mask described in FIGS. 5 and 6. The masks suggested to grow the pillars in prior embodiments related to FIG. 4, could also be used here to etch the semiconductor in the filled trench and generate pillars of metal within the semiconducting trench. One can also simply imagine the use of anisotropic wet etch to generate a facetted surface within the trench (such as using KOH to expose 111 facets) in order to use the vertical dimension and increase contact area.

The examples shown in FIGS. 5 and 6 includes a Si FinFET but could also apply, with modifications, to III-V FETs. We also note that in the step described in FIG. 6C an etch which would be tapered (non vertical sidewalls) would both increase contact area further and decrease the overall resistance of the penetrating metal fin hence contributing further to a decrease in contact resistance for the device.

The embodiments herein thus provide a contact that utilizes the dimension out of plane i.e. bending the active region up, alongside the gate, to allow for three times or more increase in contact area compared to the usual near horizontal contact.

What is claimed is:

1. A field-effect transistor (FET) including a planar source region and a planar drain region, the FET comprising:
   free-standing epitaxial pillars with a hollow core,
   wherein the pillars are cladded and grown from a surface of the planar source region and the planar drain region through an oxide layer.

2. A method of manufacture of a contact for a field-effect transistor (FET) including a planar source region and a planar drain region, and a semiconductor structure formed on a top of the planar source region and the planar drain region, the method comprising:
   increasing a contact area using a vertical dimension between gates to form an elbow contact by:
      growing free-standing epitaxial pillars with a hollow core, through an oxide layer, by patterning a mask over the planar source region and the planar drain region of the device; and
      during the growing, using a growth chamber to grow the pillars perpendicular to the semiconductor structure.

3. The method of claim 2, wherein the pillars are formed by one of:
   epitaxial growth;
   etching a highly doped Si region; and
   recrystallizing a highly doped amorphous semiconductor region.

4. The method of claim 2, wherein the hollow core is formed by etching a center core of the free-standing epitaxial pillars.

5. A method of manufacture of a contact for a field-effect transistor (FET), the method comprising:
   patterning a mask above a source and drain of a FET to form holes in said mask;
   growing epitaxial structures having a hollow core from the holes in said mask; and
   growing a doped epitaxial shell to coat sidewalls of the epitaxial structures.

* * * * *